US009231319B2

(12) United States Patent
Qian et al.

(10) Patent No.: US 9,231,319 B2
(45) Date of Patent: Jan. 5, 2016

(54) ELECTRICAL CONNECTOR ASSEMBLY WITH A SUPPORTING PLATE AND ASSEMBLY METHOD OF THE SAME

(71) Applicant: HON HAI PRECISION INDUSTRY CO., LTD., New Taipei (TW)

(72) Inventors: Qiu Qian, Kunshan (CN); Xin-Xin Li, Kunshan (CN); Chun-Sheng Li, Kunshan (CN); Jian-Kuang Zhu, Kunshan (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/328,728

(22) Filed: Jul. 11, 2014

(65) Prior Publication Data

US 2015/0017821 A1 Jan. 15, 2015

(30) Foreign Application Priority Data

Jul. 11, 2013 (CN) .......................... 2013 1 0290768

(51) Int. Cl.

| | |
|---|---|
| ***H01R 12/00*** | (2006.01) |
| ***H05K 1/00*** | (2006.01) |
| ***H01R 12/70*** | (2011.01) |
| ***H01R 12/77*** | (2011.01) |
| ***H01R 13/504*** | (2006.01) |
| ***H01R 13/627*** | (2006.01) |
| ***H01R 43/20*** | (2006.01) |
| ***H01R 43/24*** | (2006.01) |
| *H01R 12/72* | (2011.01) |
| *H01R 12/79* | (2011.01) |

(52) U.S. Cl.

CPC .......... *H01R 12/7005* (2013.01); *H01R 12/771* (2013.01); *H01R 13/504* (2013.01); *H01R 13/6275* (2013.01); *H01R 43/20* (2013.01); *H01R 43/24* (2013.01); *H01R 12/724* (2013.01); *H01R 12/774* (2013.01); *H01R 12/79* (2013.01)

(58) Field of Classification Search

CPC ............... H01R 13/629; H01R 13/504; H01R 13/6275; H01R 12/7005; H01R 12/771; H01R 12/724; H01R 12/774; H01R 12/79; H01R 12/70; H01R 43/24; H01R 43/20

USPC ........................................... 439/64, 374, 492

See application file for complete search history.

(56) References Cited

U.S. PATENT DOCUMENTS

2014/0206208 A1 * 7/2014 Qian et al. ...................... 439/79

FOREIGN PATENT DOCUMENTS

| | | |
|---|---|---|
| TW | 201214899 A1 | 4/2012 |
| TW | M451706 U1 | 4/2013 |

* cited by examiner

*Primary Examiner* — Javaid Nasri

(74) *Attorney, Agent, or Firm* — Wei Te Chung; Ming Chieh Chang

(57) ABSTRACT

An electrical connector assembly includes an electrical connector and a complementary connector mated with the electrical connector. The electrical connector includes a shell and a terminal module received in the shell. The shell defining a mating portion extending forwardly and a receiving room recessed from the rear face thereof. The mating portion defines a mating face at a side surface thereof. The terminal module includes an insulator and a plurality of first terminals retained in the insulator. The insulator defines a first face and a second face opposite to the first face. The first terminals includes contacting portions protruding from the first face of the insulator. A supporting plate is inserted between the second face of the insulator and an inner surface of the receiving room and pushing the contacting portions of the first terminals exposed to the mating face.

20 Claims, 13 Drawing Sheets

ELECTRICAL CONNECTOR ASSEMBLY WITH A SUPPORTING PLATE AND ASSEMBLY METHOD OF THE SAME

BACKGROUND OF THE INVENTION

1. Field of the Invention

The present invention generally relates to an electrical connector assembly and an assembly method of the connector, and more particularly to an electrical connector assembly with a supporting plate.

2. Description of Related Art

A patent publication application No. 201214899 in Taiwan discloses an electrical connector. The electrical connector includes a metal shell and a terminal module retained in an insulative housing. The metal shell defines a mating portion extending forwardly and a receiving room recessed from the rear face thereof. The mating portion defines a mating face which has a cutout thereof. The terminal module includes an insulator assembled into the receiving room from the rear face of the metal shell and a plurality of conductive terminals retained in the insulator. Contacting portions of the conductive terminals extend outwardly beyond the cutout and expose to the mating face. After the terminal module is assembled into the receiving room, plastic material is poured into the cutout to seal gaps between the insulator and the terminal module. However, the pouring of the plastic material might push the terminal module offset a right position or if the terminal module is disposed at an offset position, the plastic material will coat on the contacting portions of the conductive terminals, which results to a bad property of contacting of the conductive terminals.

In view of the foregoing, an electrical connector assembly with a supporting plate and the assembly method thereof would be desirable.

SUMMARY OF THE INVENTION

Accordingly, an object of the present invention is to provide an electrical connector assembly, which made the terminal module be placed in a suitable position due to a supporting plate.

In order to achieve the object set forth, an electrical connector assembly includes an electrical connector including a shell and a terminal module received in the shell. The shell defines a mating portion extending forwardly and a receiving room recessed from the rear face thereof. The mating portion defines a mating face at a side surface thereof. The terminal module includes an insulator and a plurality of first terminals retained in the insulator. The insulator defines a first face and a second face opposite to the first face. The first terminals include contacting portions protruding from the first face of the insulator. A supporting plate is inserted between the second face of the insulator and an inner surface of the receiving room and pushing the contacting portions of the first terminals exposed to the mating face.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Figure 1:
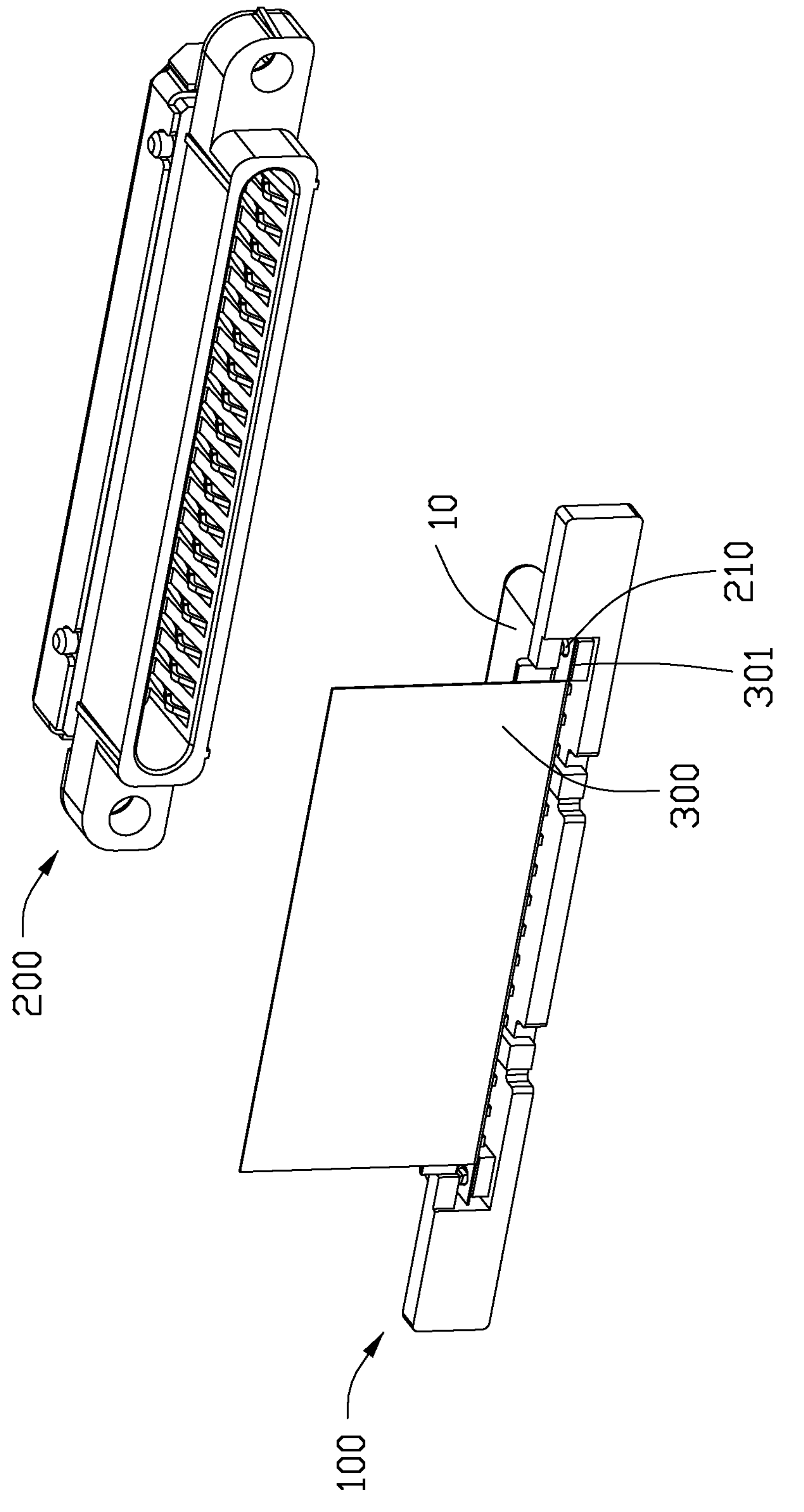
FIG. 1 is a perspective view of an electrical connector assembly comprising an electrical connector is intended to mate with a complementary connector in accordance with the present invention.

Referring to FIG. 1, the present invention provides an electrical connector assembly comprising an electrical connector 100 and a complementary connector 200 mated with the electrical connector 100. The electrical connector 100 is a cable connector type connecting with a flat cable 300 at a rear end thereof. The complementary connector 200 is a board connector type used for connecting with the printed circuit board. Combining to FIG. 2, the electrical connector 100 comprises a shell 10, a terminal module 20 retained in the shell and a supporting plate 30.

Figure 2:
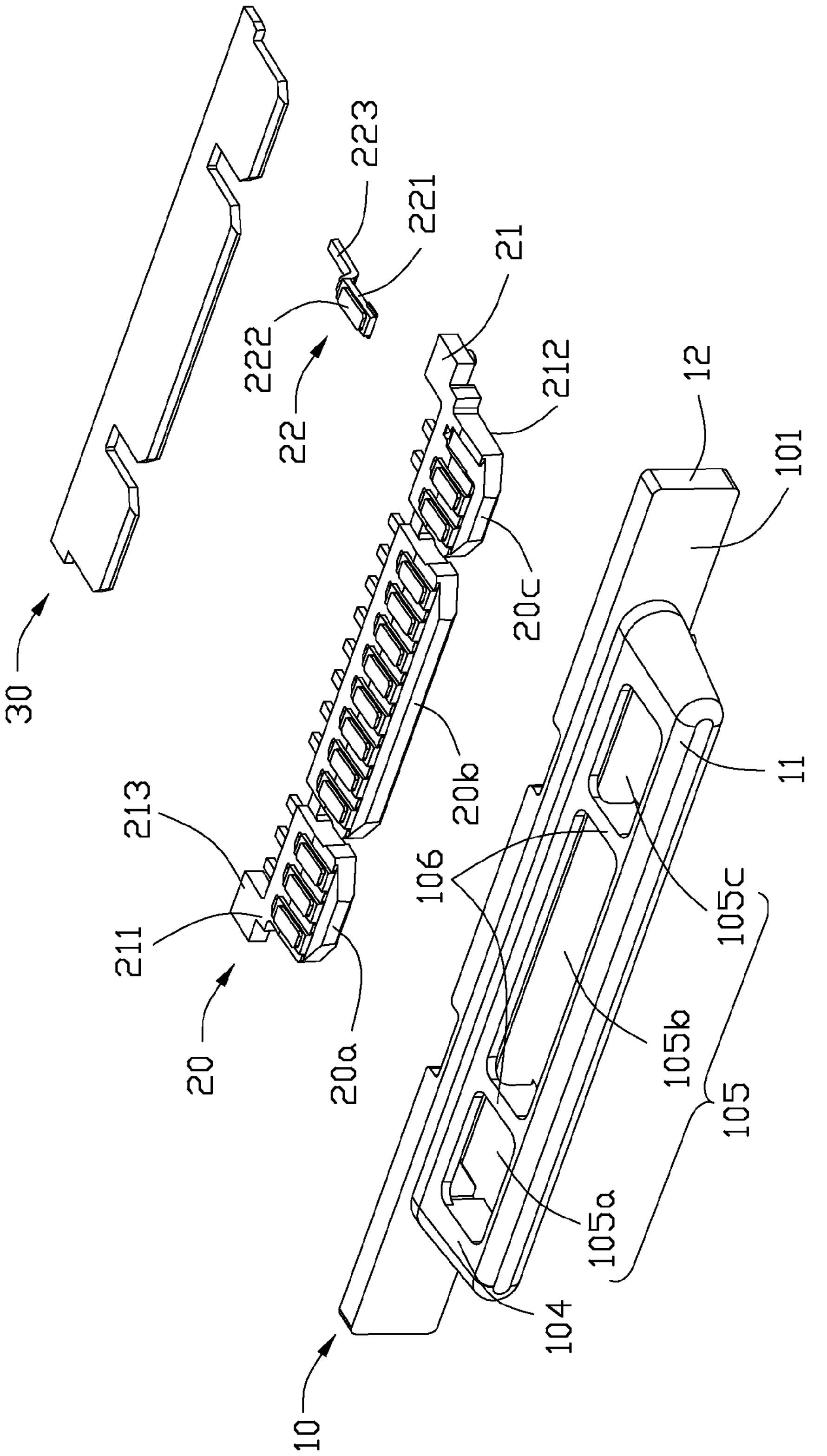
FIG. 2 is an exploded perspective view of the electrical connector in FIG. 1.

Referring to FIG. 2, the shell 10 is formed by an insert molded method. The shell 10 comprises a vertical flat portion 12 and a mating portion 11 extending forwardly from a front face 101 of the flat portion 12. A receiving room 103 is recessed from a rear face 102 of the flat portion 12 to the mating portion, as shown in the FIG. 3. The mating portion 11 is configured as cone-shaped with the upper and lower face, and the left and right face extending slantly to the centre of the receiving room 103, as clearly shown in FIG. 5 and FIG. 9. The mating portion 11 defines a mating face 104 at the upper and lower surfaces thereof, which have a cutout portion 105 communicating with the receiving room 103. In the best embodiment, the cutout portion 105 has three independent sub-cutout portions **105*a*, 105*b*, 105*c* arranged along the lengthwise direction and spaced by two connecting ribs 106. That is to say, the sub-cutout portions 105*a*, 105*b*, 105*c* are arranged on the mating face 104 along the lengthwise direction perpendicular to the mating direction. The length of the sub-cutout portion 105*b* in middle is longer than the other two sub-cutout portions 105*a*, 105*c* along the lengthwise direction, the three sub-cutout portions 105*a*, 105*b*, 105*c*** have a same width.

The terminal module 20 includes an insulator 21 and a plurality of first terminals 22 embedded in the insulator 21. The insulator 21 defines a first face 211 and a second face 212 opposite to the first face 211. Each of the first terminals 22 includes a retaining portion 221 embedded in the insulator 21, a contacting portion 222 protruding upwardly from the retaining portion 221 beyond the first face 211 and a connecting portion 223 extending rearward from the retaining portion 221 and beyond the insulator. Each of the contacting portions 222 is attached on the corresponding retaining portion 221. Of course, the contacting portion 222 of each terminal may be integrated with the retaining portion 221 if the metal plate from which the terminals are made is thickness enough. In the best embodiment, the terminal module 20 includes three independent terminal sub-modules 20*a*, 20*b*, 20*c* separated from each other. The terminal sub-modules are arranged side by side and connect with each other at a rear end thereof. The supporting plate 30 is configured as a flat shape and is roughly same to the terminal module.

Figure 3:
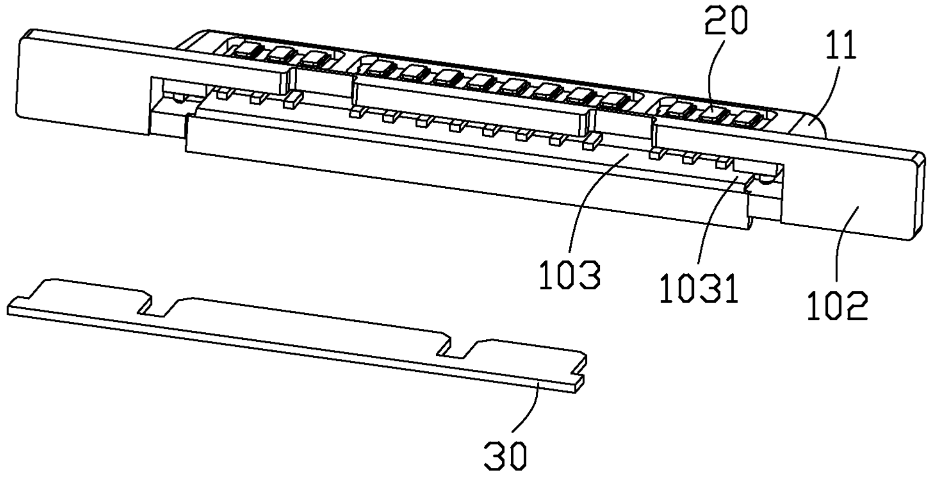
FIG. 3 is a perspective view of the electrical connector after a terminal module is assembled into the shell in FIG. 2.
Figure 4:
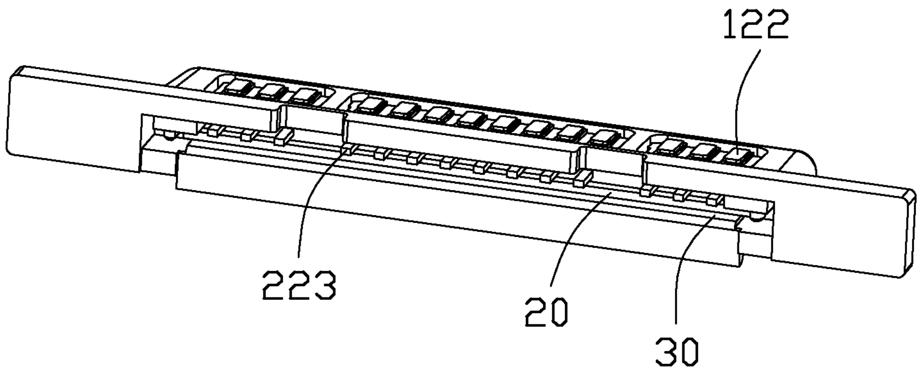
FIG. 4 is a perspective view of the electrical connector after a supporting plate is assembled into the shell in FIG. 3.
Figure 5:
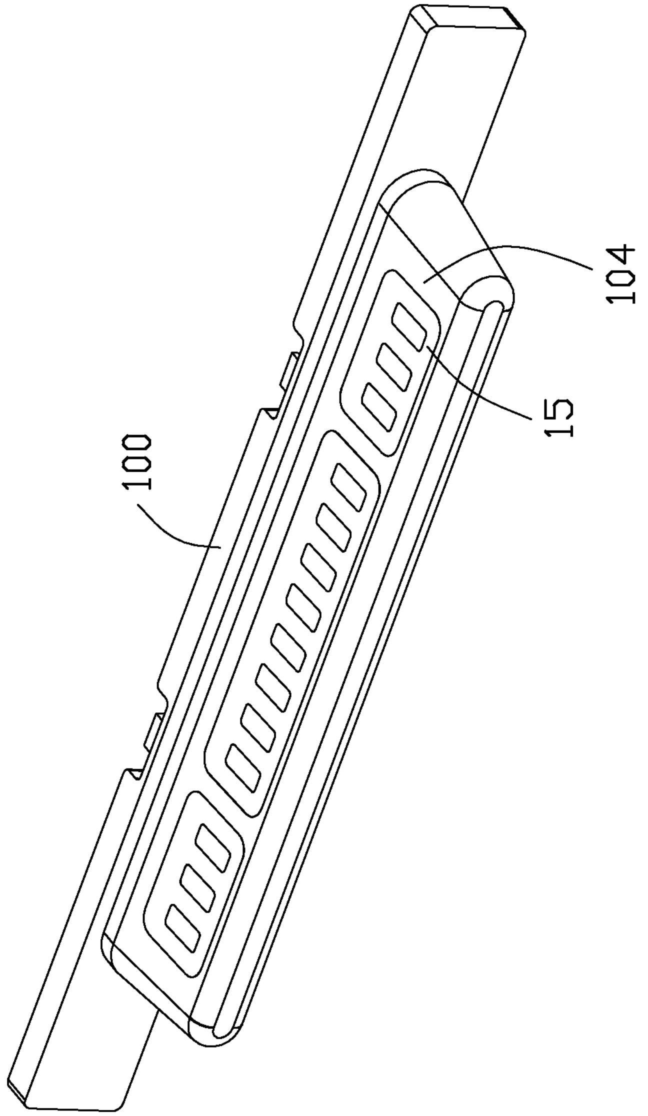
FIG. 5 is a perspective view of the electrical connector after the plastic material is poured into the shell in FIG. 4.

Referring to FIG. 3, illustrating an assembly of the connector, firstly, the terminal module 20 is inserted into the receiving room 103 of the shell 10. The first face 211 of the insulator 21 is under the cutout portion 105. The three terminal sub-modules 20*a*, 20*b*, 20*c* are separated below the three sub-cutout portions 105*a*, 105*b*, 105*c* of the shell 10. Secondly, referring to FIG. 4, the supporting plate 30 is inserted into a place between the second face 212 of the insulator 21 and the inner surface 1031 of the receiving room 103, as clearly shown in FIG. 10. Each of the connecting portions 223 of the first terminals is located behind the supporting plate 30. The supporting plate 30 is pushed on the second face 212 of the insulator 21, and the first face 211 of the insulator 21 is pushed on another inner surface of the receiving room 103, so that the contacting portion 222 of the first terminal 22 protrudes to the cutout portion 105 and exposes to the mating face 104 of the mating portion 11. In the embodiment, the structure of the supporting plate 30 is same to the insulator 21. In the specific implementation, the supporting plate 30 could be many small supporting blocks. These supporting blocks are pushed into gaps between the insulator 21 and the receiving room 103 after the terminal modules are inserted into the receiving room 103, so that the first face 211 of the first terminals 22 are pushed on the inner surface of the receiving room 103, thereby the contacting portion 222 of the first terminals 22 being aligned with the mating face 104 of the mating portion 11. Finally, referring to FIG. 5, pouring liquid plastic material to the three sub-cutout portions 105*a*, 105*b*, 105*c* of the mating portion 11 in order to made the appearance of electrical connector 100 be more beautiful and better sealed. The plastic material 15 seal the terminal module 20 in order to connect the terminal module 20 with the shell 10 closely. Referring to FIG. 5, the plastic material 15 and the mating face 104 of the mating portion are in a same plane after the one is freezed.

Figure 6:
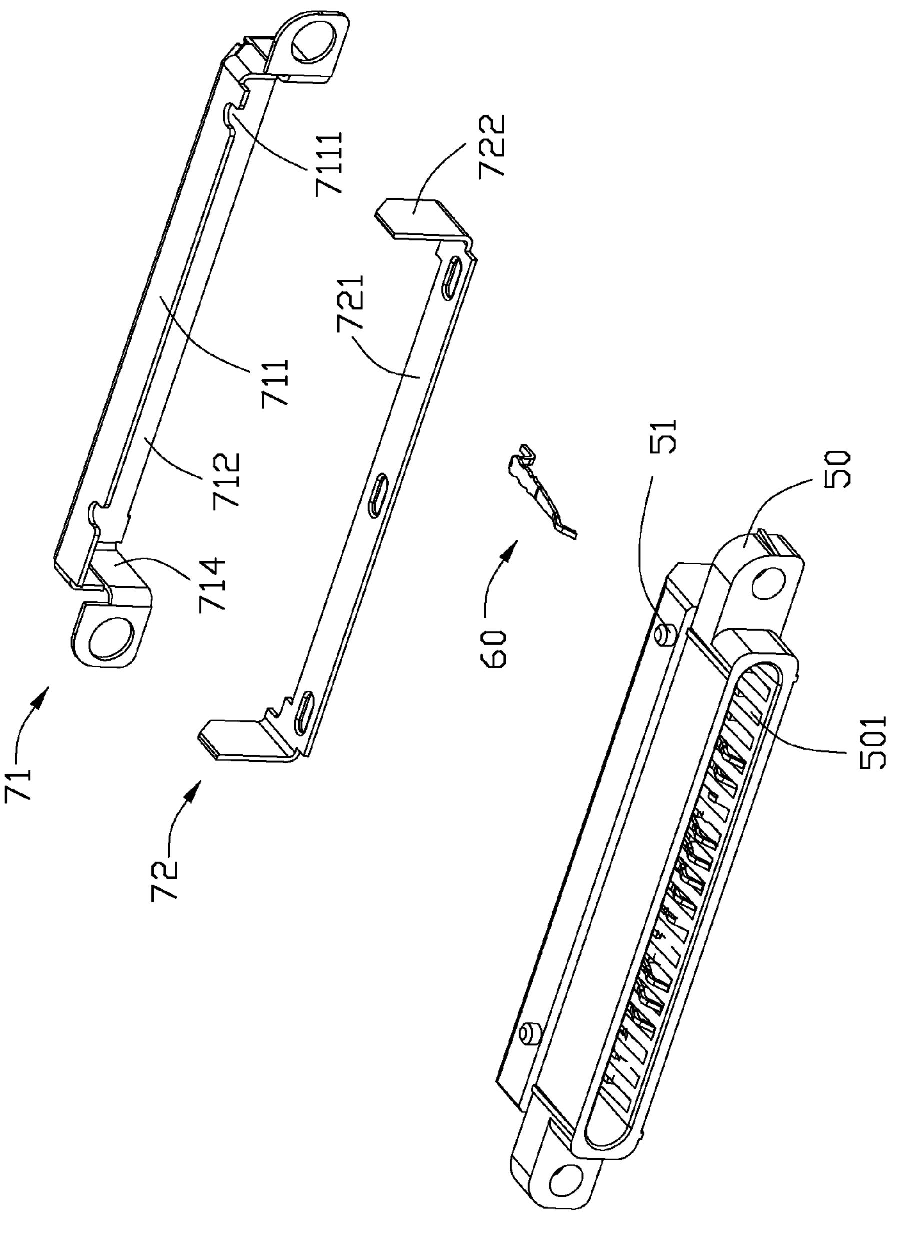
FIG. 6 is an exploded perspective view of the complementary connector in FIG. 1.
Figure 7:
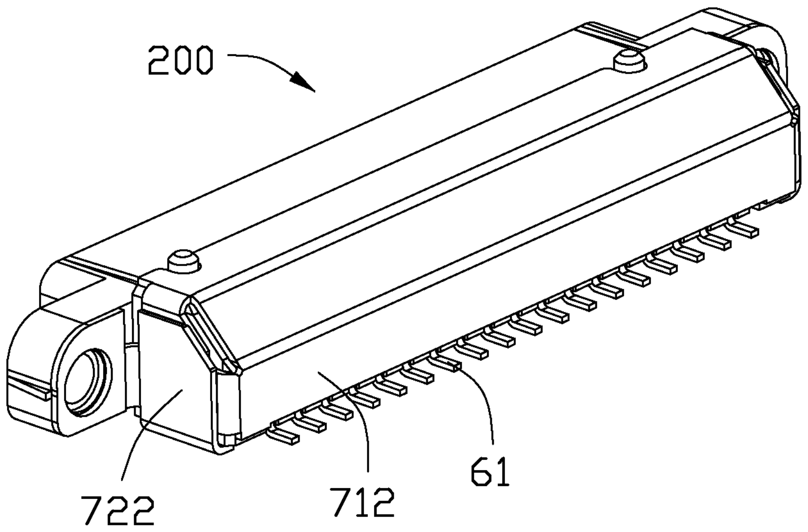
FIG. 7 is a perspective view of the complementary connector.

Referring to FIG. 6 and FIG. 7, the complementary connector 200 comprises an insulative housing 50, a plurality of second terminals 60 retained in the insulative housing 50 and a first shield shell 71 and a second shield shell 72 surrounding the insulative housing 50. The insulative housing 50 defines a mating cavity 501 recessed from a front face thereof for receiving the mating portion 11 of the electrical connector 100. The mating cavity 501 is configured as cone-shaped in accordance with the mating portion 11 of the electrical connector 100. The first shield shell 71 is assembled to the insulative housing 50 with an opening 7111 defined along a front edge of the upper wall thereof. The opening 7111 is adapted for matching with the post 51 protruding from the upper surface of the insulative housing. The rear wall 712 and the two side walls 714 connect to the upper wall 711 respectively, and said four walls cover the upper surface, the rear surface and the two side surfaces of the insulative housing, respectively. Soldering section 61 of the second terminals 60 are located below the rear wall 712 and extend out of the rear wall 712. The second shield shell 72 includes a body portion 721 enclosing the low face of the insulative housing 50, and two extending portions 722 extending from two sides of the body portion 721 and located in the outer of the side walls 714 of the first shield shell 71. The side walls 714 of the first shield shell 71 and the extending portions 722 of the second shield shell 72 are combined by a spot welding technology.

Figure 8:
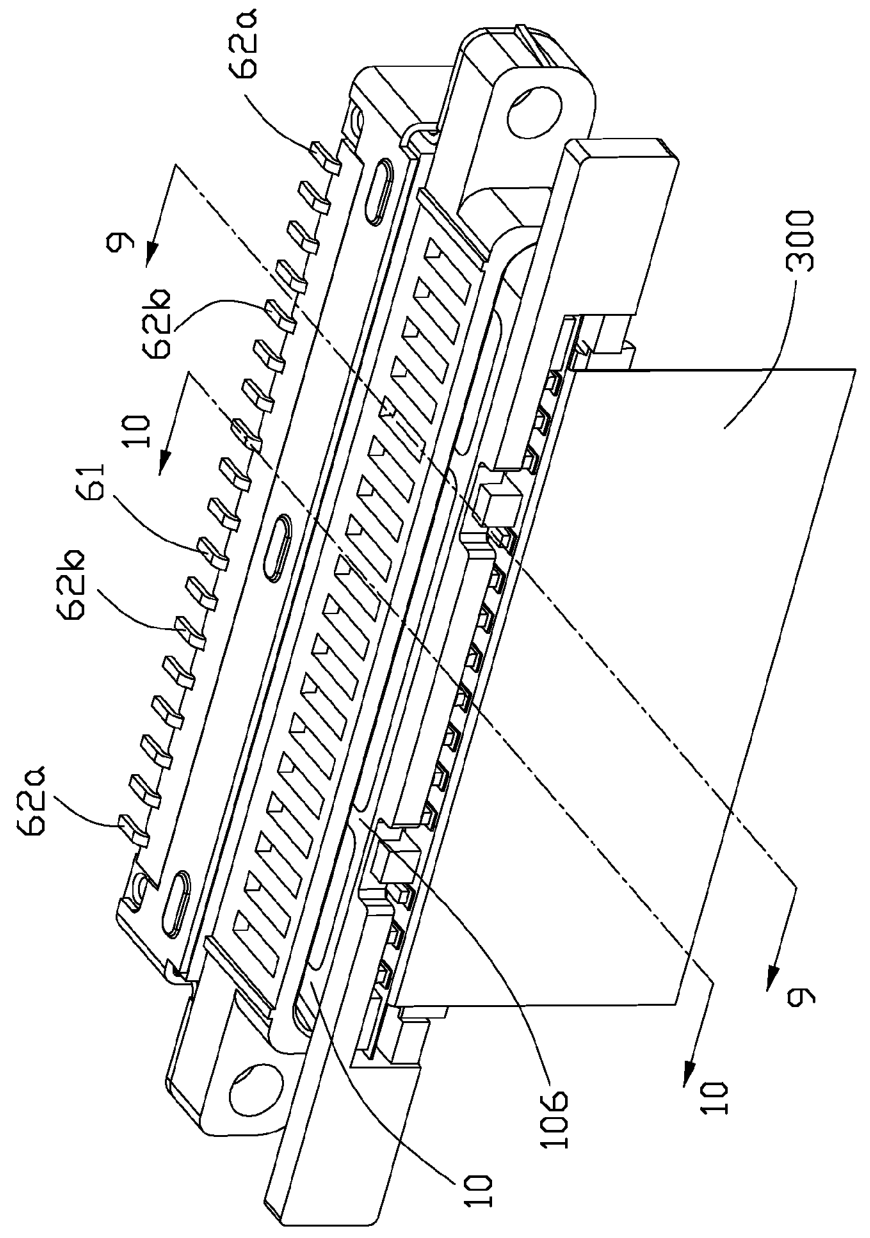
FIG. 8 is a perspective view of the electrical connector assembly after the two connector are mated with each other.
Figure 9:
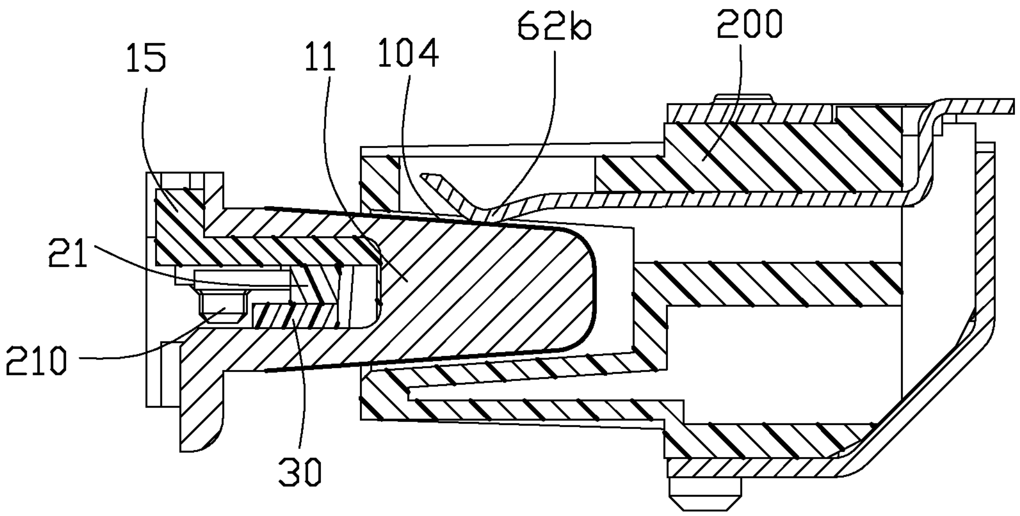
FIG. 9 is a cross sectional view of the electrical connector assembly taken along lines 9-9.

Referring to FIG. 8 and FIG. 9, the second terminals are arranged in one row in the mating cavity 501 along the lengthwise direction. Two of the second terminals 60 disposed at the outermost of the row are grounding terminals 62*a*. Two of the second terminals 60 aligned with the connecting ribs 106 of the electrical connector 100 are grounding terminals 62*b*. In the embodiment, the shell 10 is conductive and the grounding terminals 62*a* directly contact with the shell and the grounding terminals 62*b* directly contact with the connecting ribs 106 of the shell 10. Therefore, the electrical connector 100 could obtain a good grounding effect without extra grounding contacts so that the structure of the connector is simple.

Figure 10:
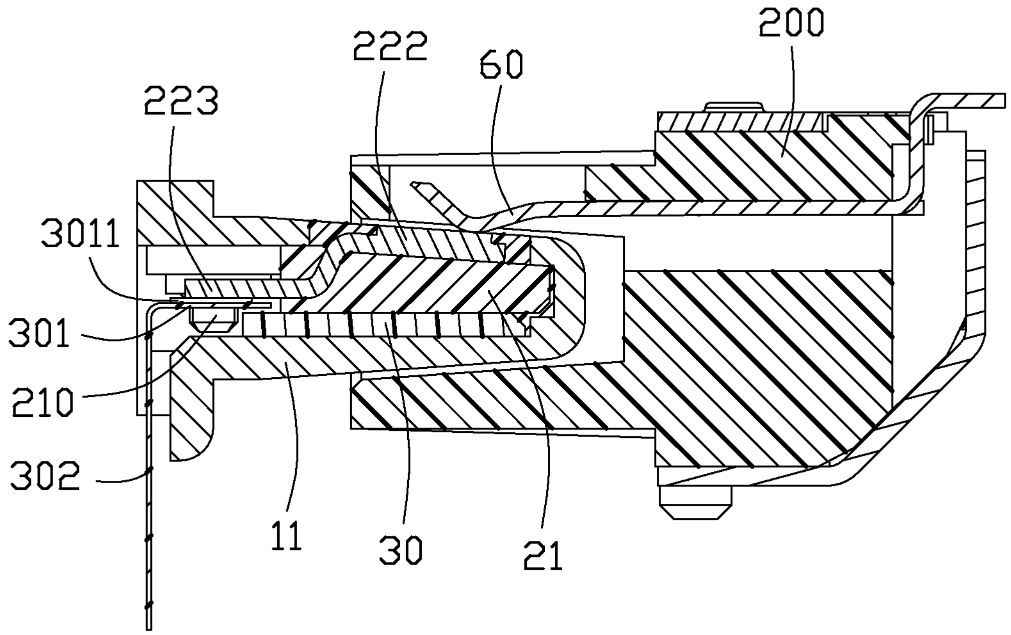
FIG. 10 is a cross sectional view of the electrical connector assembly taken along lines 10-10.

Referring to FIG. 10, the second terminals 60 of the complementary connector 200 used for signal transmission directly contact with the contacting portions 222 of the first terminals 22 of the electrical connector 100. Combining to FIG. 2, the insulator 21 of the electrical connector 100 defines two opposite ear portions 213 extending rearwards and outwards along a rear end portion thereof. Each of the ear portions 213 further defines a retaining post 210 extending downwardly used for fixing a flexible printed circuit 300. In the embodiment, the flexible printed circuit 300 configured as L-shaped and includes an insert portion 301 fixed on the insulator 21 and an outer portion 302 perpendicular to the insert portion 301 extending beyond the shell 10. The insert portion 301 defining two opposite fixing holes at two side portions thereof is wider than the outer portion 302 along the lengthwise direction. The fixing holes are matched with the retaining posts 210 in order to made the flexible printed circuit 300 be fixed on the insulator 21, as clearly shown in FIG. 1. Besides, the flexible printed circuit 300 defines a plurality of solder pads 3011 disposed in one row on the upper surface of the insert portion 301 along the lengthwise direction corresponding to the connecting portions 223 of the first terminals 22. Therefore, a signal transmission route is formed along the line of second terminals, the first terminals and the flexible printed circuit. In other embodiments, the insert portion 301 may define a metal plate attached at a lower surface thereof in order to enhance the strength of the insert portion 301. The formation of the metal plate can also use gold plating method.

Figure 11:
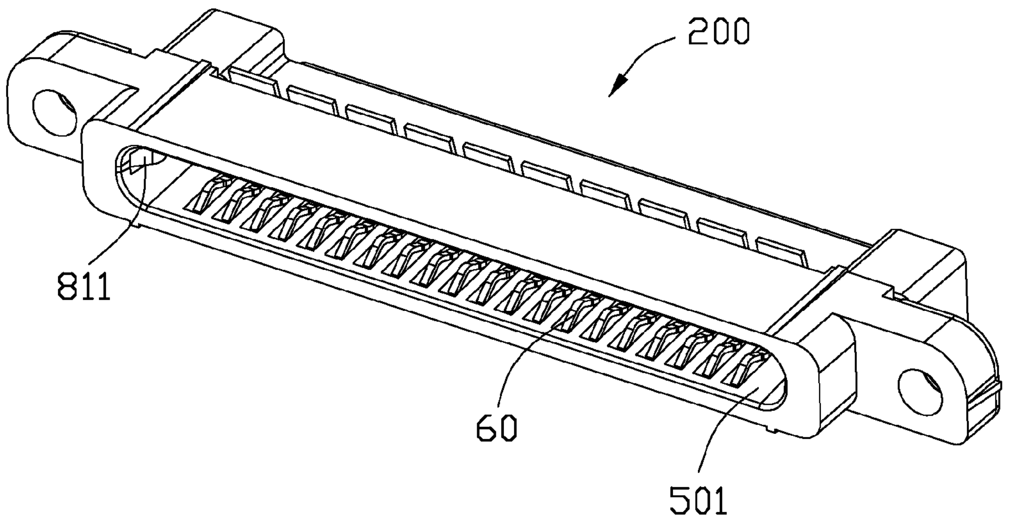
FIG. 11 is a perspective view of the complementary connector in another implementation way in accordance with the present invention.
Figure 12:
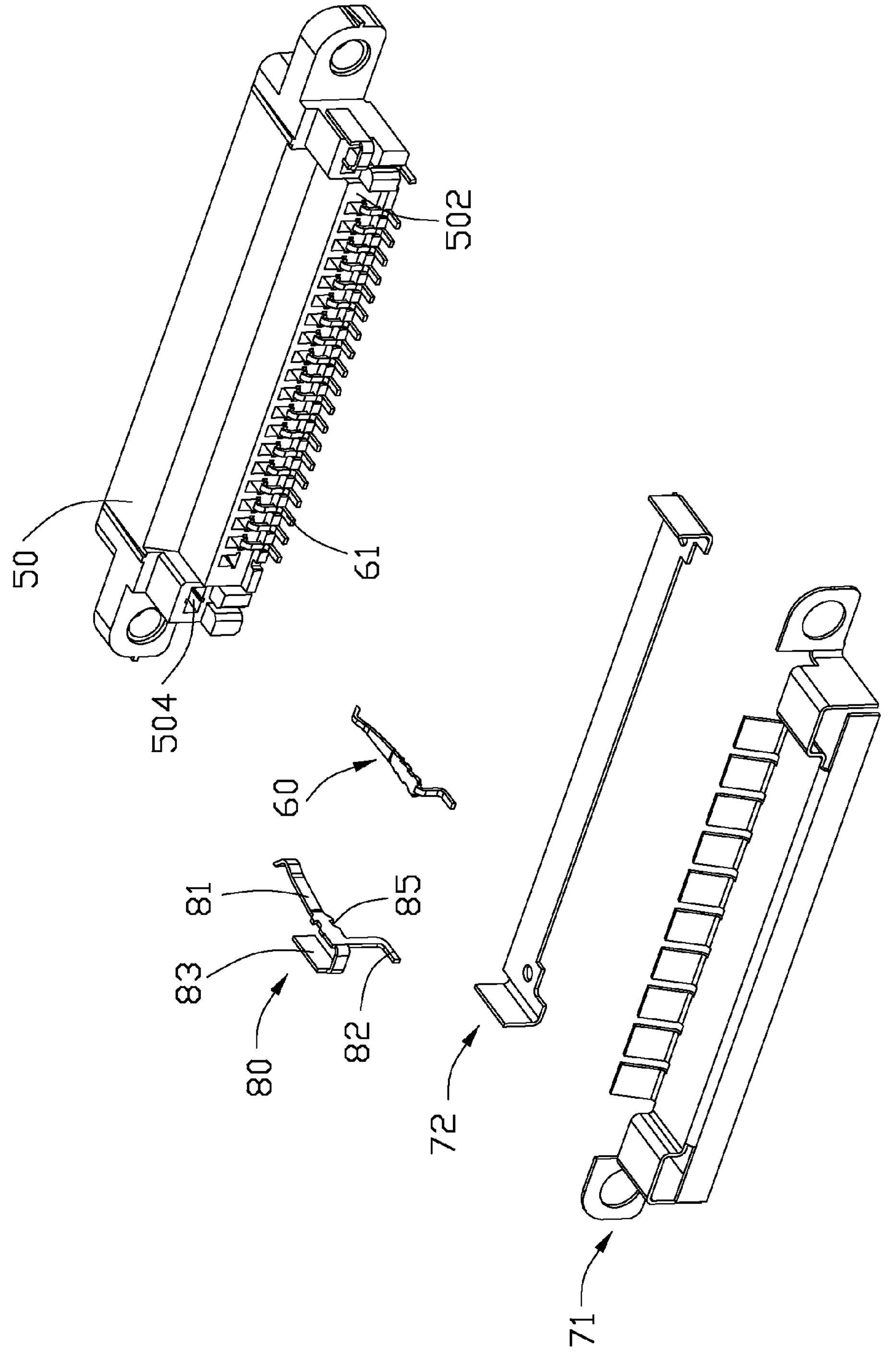
FIG. 12 is an exploded perspective view of the complementary connector shown in FIG. 11.
Figure 13:
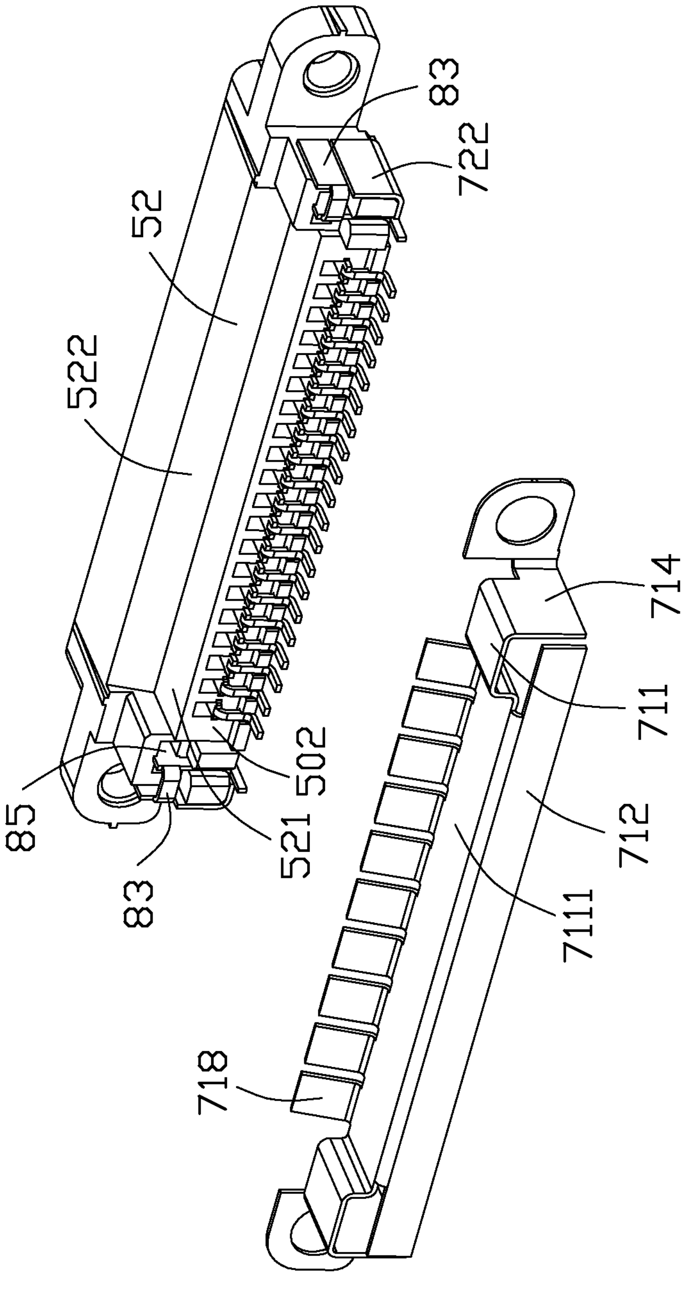
FIG. 13 is a part exploded perspective view of the complementary connector shown in FIG. 11.

Referring to FIG. 11 and FIG. 13 illustrating a second embodiment of the present invention, a complementary connector 200 added with a pair of latch members 80 is shown. The main difference from the first embodiment is adding the pair of latch members 80 retained in the insulative housing 50. The description hereinafter will be only related to the difference therebetween with the same marks and features will be in accordance with the same structure. The same structure will not be described again in this embodiment. Referring to FIG. 12, each of the latch members 80 includes a fixed section 85, a contacting arm 81 extending forwardly from the fixed section 85, a soldering portion 82 extending downwardly from the fixed section 85 and an engagement portion 83 bending outwardly from the fixed section 85. The insulative housing 50 defines two holes 504 at two opposite sides, which run through a rear end face 502 of the housing. The holes 504 extend forwardly for communicating with the mating cavity 501. The latch members 80 are inserted into the holes 504 from the rear end face 502 until the contacting arms 81 are located at two sides of the mating cavity 501. The soldering sections 82 extend rearwards beyond the rear end face 502 of the insulative housing 50, and the engagement sections 83 enclose the outer surface of the insulative housing. Combining to FIG. 11, each of the contacting arms 81 defines an arc-shaped contacting section 811 protruding into the mating cavity 501. The contacting sections 811 are retained in the two sides of the mating portion 11 of the electrical connector 100 when the electrical connector 100 mated with the complementary connector 200 so as to enhance the retaining force between the electrical connector 100 and the complementary connector 200.

Referring to FIG. 13, the insulative housing 50 of the complementary connector 200 defines an aperture 52 recessed from the upper surface thereof and running through the rear end face 502. The upper wall 711 of the first shield shell 71 is stamped downwardly to form a lower recess 7111. The aperture 52 includes a horizontal face 521 and an inclined face 522 connecting with the horizontal face 521, the two faces are in an obtuse angle. The rear wall 712 connects with the lower recess 7111. The lower recess 7111 extends a plurality of comb adjacent portions 718 upwardly from the edge opposite to the rear wall 712. The lower recess 7111 covers the horizontal face 521, and the adjacent portions 718 are adjacent to the inclined face 522. Each of the engagement sections 83 of the latch members 80 is above the extending portion 722 of the second shield shell 72. The side walls 714 of the first shield shell 71 are located outside of the engagement sections 83 of the latch members and extending portions 722 of the first shield shell 71 and they are combined via the spot welding technology. The latch members 80 of the complementary connector 200 are electrical conductive structure while the mating portion 11 of the electrical connector 100 is electrical conductive structure. The grounding effect between the electrical connector 100 and the complementary connector 200 is obtained when the latch members 80 are latched on the mating portion 11. The first shield shell 71 connects with the latch members 80 and the second shield shell 72 so that achieves better shielding effect.

In the specific implementation, the two sides of the mating portion 11 of the electrical connector 100 could be set two arc-shaped notches corresponding to the contacting sections 811. In the mating process, the contacting sections 811 are latched in the notches of the mating portion. The arc-shaped contacting sections 811 are easy to get out of the arc-shaped notches when the electrical connector 100 separated from the complementary connector 200.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

We claim:

1. An electrical connector assembly comprising:

an electrical connector comprising:

a shell having a mating portion extending forwardly and a receiving room recessed from a rear face thereof, the mating portion defining a mating face at a side surface thereof;

a terminal module received in the shell, the terminal module including an insulator and a plurality of first terminals retained in the insulator, the insulator defining a first face and a second face opposite to the first face, the first terminals comprising contacting portions protruding from the first face of the insulator;

a supporting plate;

wherein the supporting plate is inserted between the second face of the insulator and an inner surface of the receiving room and pushing the contacting portions exposed to the mating face.

2. The electrical connector assembly as claimed in claim 1, wherein the mating face of the mating portion defining a cutout portion communicating with the receiving room, the contacting portions of the first terminals protruding into the cutout portion and filled with plastic material.

3. The electrical connector assembly as claimed in claim 2, wherein the terminal module includes three terminal sub-modules connecting with each other, and the cutout portion of the mating portion including three sub-cutout portions spaced from each other and received the three terminal sub-modules, and the shell is conductive and defines connecting ribs located between the sub-cutout portions.

4. The electrical connector assembly as claimed in claim 3, comprising a complementary connector mating with the electrical connector, the complementary connector comprising an insulative housing, a plurality of second terminals retained in the insulative housing and a shield shell, the second terminals including a plurality of signal terminals and grounding terminals, and some of the grounding terminals contacting with the connecting ribs of the electrical connector, and some of the grounding terminals contacting with the shielding shell.

5. The electrical connector assembly as claimed in claim 1, comprising a flexible printed circuit configured as L-shaped and comprising an insert portion fixed on the insulator and an outer portion extending beyond the shell perpendicular to the insert portion, the insert portion defines a plurality of solder pads disposed in one row along the lengthwise direction corresponding to the connecting portions of the first terminals.

6. An assembly method of an electrical connector, the assembly method comprising:

providing a plurality of first terminals, the first terminals comprising contacting portions;

forming a terminal module via an insert molding process, the terminal module comprising an insulator and said first terminals embedded in the insulator when the terminal module is cooled, the insulator defining a first face and a second face opposite to the first face, and the contacting portions of the first terminals exposed to the first face of the insulator;

providing a shell defining a mating portion and an receiving room recessed from a rear face to the mating portion, and the mating portion having a mating face defining a cutout portion communicating with the receiving room;

inserting the terminal module into the receiving room from the rear face of the shell;

inserting a supporting plate into the receiving room from the rear face of the shell, the supporting plate pushing against the second face of the insulator, thereby the first face of the insulator against the inner surface of the receiving room and the contacting portions of the first terminals protruding into the cutout portion.

7. The assembly method of the electrical connector assembly as claimed in claim 6, wherein the cutout portion of the mating portion is filled with plastic material sealing the terminal module and the mating portion, and the plastic material and the mating face and the terminal module are in a same plane.

8. The assembly method of the electrical connector assembly as claimed in claim 6, wherein the shell is of an electrical conductive structure and defines two connecting ribs located in the cutout portion and including three sub-cutout portions.

9. An electrical connector assembly comprising:

a first electrical connector including:

a metallic shell including a base and a mating portion extending forwardly from the base in a front-to-back direction, said mating portion defining therein a receiving room communicating with an exterior, in a vertical direction perpendicular to said front-to-back direction, via at least one through opening in an mating face thereof;

a terminal module forwardly, along the front-to-back direction, inserted into and successively received in the receiving room and including a plurality of contacts retained within an insulator, each of said contacts including a contacting portion located in the corresponding through hole and exposed upon the mating face in the vertical direction, and a tail portion mechanically and electrically connected to a cable; and a supporting plate discrete from the terminal module and forwardly, along the front-to-back direction, inserted into the and received in the receiving room only after the terminal module has been received within the receiving room so as to intimately contact the terminal module to urge the terminal module to the mating face in the vertical direction.

10. The electrical connector assembly as claimed in claim 9, wherein an insulative material fills remaining portions of the through opening to surround the contacting portions of the contacts, and flush with the mating face.

11. The electrical connector assembly as claimed in claim 10, wherein said insulative material further fills the receiving room behind the terminal module so as to prevent backward movement of the terminal module in the front-to-back direction.

12. The electrical connector assembly as claimed in claim 10, wherein most portions of the insulator is sandwiched between the shell and the supporting plate in the vertical direction.

13. The electrical connector assembly as claimed in claim 12, wherein some portions of the insulator is sandwiched between the insulative material and the supporting plate in the vertical direction.

14. The electrical connector assembly as claimed in claim 13, wherein the shell includes a connecting rib extending into the receiving room in the vertical direction, and said connecting rib is aligned with said some portions of the insulator in the front-to-back direction.

15. The electrical connector assembly as claimed in claim 14, wherein the supporting plate defines a cutout to receiving said connecting rib therein.

16. The electrical connector assembly as claimed in claim 10, wherein the terminal module is made via an insert molding process, and said insulative material is filled within the receiving room via another insert molding process.

17. The electrical connector assembly as claimed in claim 9, further including a second electrical connector receiving said mating portion, wherein said second electrical connector includes a pair of metallic latching members mechanically and electrically connected to two opposite ends of the mating portion in a lengthwise direction perpendicular to both said front-to-back direction and said vertical direction.

18. The electrical connector assembly as claimed in claim 17, wherein said second electrical connector further includes a plurality of signal terminals mechanically and electrically connected to the contacting portions of the contacts in the vertical direction, and grounding terminals mechanically and electrically connected to the mating portion of the shell in the vertical direction.

19. The electrical connector assembly as claimed in claim 9, wherein said cable is a flexible printed circuit (FPC) equipped with a pair of positioning holes, and the insulator includes a pair of mounting posts extending through said pair of positioning holes, respectively.

20. The electrical connector assembly as claimed in claim 19, wherein said FPC extends in the vertical direction to cover the supporting plate.

* * * * *